United States Patent [19]

Bilotti et al.

[11] Patent Number: 5,075,568
[45] Date of Patent: Dec. 24, 1991

[54] SWITCHING BIPOLAR DRIVER CIRCUIT FOR INDUCTIVE LOAD

[75] Inventors: Alberto Bilotti, Florida; Jose L. Tallarico, Buenos Aires, both of Argentina

[73] Assignee: Allegro Microsystems, Inc., Worcester, Mass.

[21] Appl. No.: 643,311

[22] Filed: Jan. 22, 1991

[51] Int. Cl.⁵ .............................................. H03K 5/00
[52] U.S. Cl. .................................. 307/270; 307/540; 307/567
[58] Field of Search ............... 307/270, 300, 540, 542, 307/549, 567

[56] References Cited

U.S. PATENT DOCUMENTS 4,603,268 7/1986 Davis ............................... 307/270 X
4,982,107 1/1991 Fayfield ........................... 307/270 X
4,988,899 1/1991 Jansson ........................... 307/300 X Primary Examiner—Robert J. Pascal

[57] ABSTRACT

A bipolar chopping driver circuit has a pair of NPN totem-pole connected driver transistors with a fly-back diode connected across the NPN source transistor and a biasing resistor connected between base and emitter of the source transistor. A fullwave bridge driver may be comprised of two such totem pole circuits with the inductive load connected between them at the junctions between NPN source and sink transistors. A clamp circuit is provided in both cases, for preventing the voltage swings at the bases of the source transistors from exceeding the DC supply voltage that is connected to the collectors of the source transistors, thereby permitting operation at high chopping frequencies without excessive delay in switching load current and excessive power losses.

6 Claims, 1 Drawing Sheet

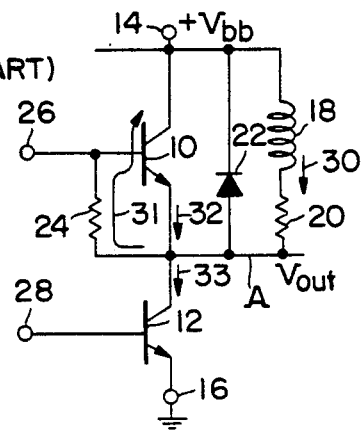
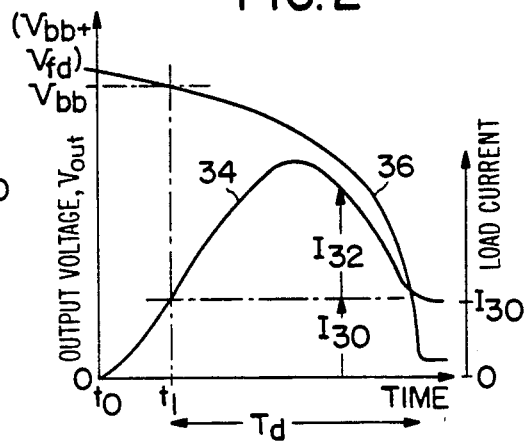
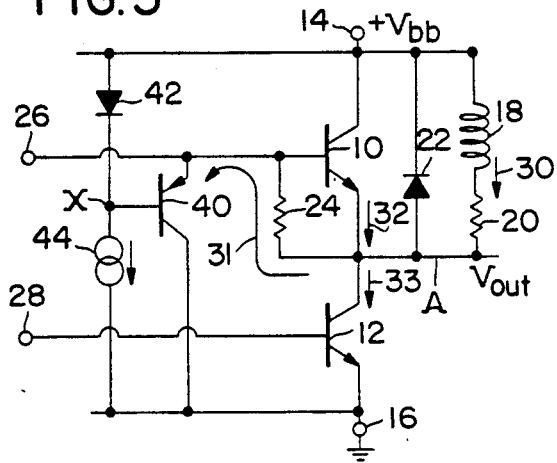
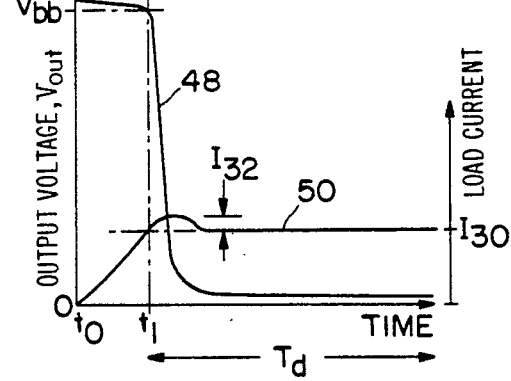
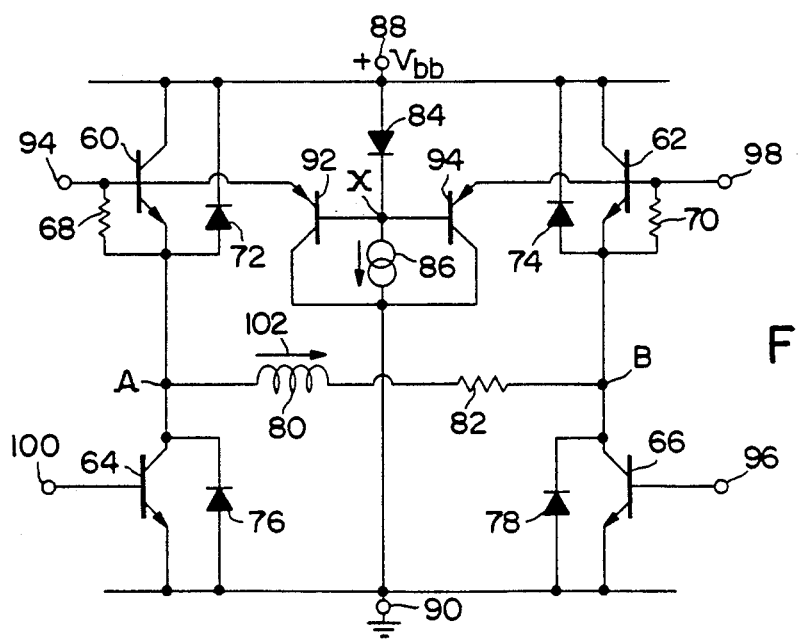

SWITCHING BIPOLAR DRIVER CIRCUIT FOR INDUCTIVE LOAD

BACKGROUND OF THE INVENTION

This invention relates to a bipolar chopping driver of the kind employing a pair of NPN totem-pole-connected driver transistors, an inductive load and a fly-back diode connected across the source transistor of the transistor pair, and more particularly to such a driver circuit wherein a clamp circuit at the base of the source transistor limits the positive voltage there to no more than the supply voltage, Vbb.

It is an object of this invention to provide a means to reduce the excessive distortions of load current and power loss that normally occurs at high chopping frequencies in such chopping driver circuits of the prior art.

SUMMARY OF THE INVENTION

A fast switching driver circuit is comprised of an NPN source transistor and a sink driver switch series connected between voltage supply and ground conductors in typical totem-pole driver circuit fashion. An inductive load may be connected at one end to the junction (circuit point A) of the source transistor and sink switch. The sink switch may be another NPN transistor. A fly-back diode is connected with cathode to the voltage supply conductor and anode to the emitter of the source transistor. A source-transistor bias resistor is connected between the base and emitter of the source transistor. A clamping circuit includes: a) a PNP transistor with emittter connected to the base of the source transistor and collector tied to ground; b) a clamp diode with anode connected to the voltage supply conductor and with anode tied to the base of the PNP clamp transistor: and c) a current source connected between the base of the clamp transistor and ground whereby the current source is poled to draw current in the forward biased direction of the clamp diode. The clamp circuit operates to draw off the portion of fly-back current that would otherwise forward bias the base-collector junction of the source driver during the period when the sink driver is turned off. Such a base to collector fly-back current in prior art circuits stores charge in the source transistor base-collector junction for high chopping frequencies, which has the effect of producing a large shoot through current at the onset of the following period when the sink transistor turns on.

Thus this clamp circuit provides a faster switching-on of load current in each instance that the sink driver is just switched on, a corresponding faster rise in voltage across the inductive load, and over all substantially reduced shoot through current and switching (power) losses. The clamp circuit of this invention provides all of these advantages without introducing any charge storage delays of its own, without interference with the normal driving of the source driver and without consuming any appreciable power.

Two such totem-pole circuits are employed together as a fullwave bridge driver for an inductive load connected between the junction of source and sink transistors of one and the other totem-pole circuit. In this case the preferred clamp circuit is comprised of one and another PNP clamp transistors having emitters respectively connected to the bases of the source transistors, a clamp diode with anode connected to the voltage supply conductor and cathode connected to the bases of the PNP clamp transistors. A current source connects the cathode of the clamp diode to the ground conductor.

BRIEF DESCRIPTION OF THE DRAWING

FIG. 1 shows a half-wave totem pole circuit of the prior art with an inductive load.

FIG. 2 shows a graph of the output voltage and load current in the prior art circuit of FIG. 1 during an interval just after the sink transistor switches on.

FIG. 3 shows a half-wave totem pole circuit of this invention with an inductive load.

FIG. 4 shows a graph of the totem pole driver circuit of FIG. 3 during an interval just after the sink transistor switches on.

FIG. 5 shows a full-wave bridge circuit of this invention having an inductive load.

DESCRIPTION OF THE PREFERRED EMBODIMENTS

A half wave totem-pole driver of the prior art having an inductive load as shown in FIG. 1 includes an NPN source transistor 10 and an NPN sink transistor 12 connected in series between the positive DC circuit supply voltage (Vbb) at terminal 14 and the circuit ground terminal 16. An inductive load, represented as an inductor 18 and a resistor 20, is connected in parallel with the source transistor 10 collector to emitter and fly-back diode 22 is also connected across the source transistor 10, emitter to collector. A resistor 24 is connected between the base and emitter of the source transistor 10 for biasing the source transistor off when there is no input voltage applied to the base of transistor 10. The input signals, i.e. at input terminals 26 and 28, of such totem pole drivers are customarily two complimentary binary voltage signals wherein the "1" and "0" voltage levels are sufficient respectively for alternately turning on and off the driver transistors 10 and 12 so that when one is on the other is off.

For the purposes of analyzing one aspect of the operation of this circuit of FIG. 1, it will be assumed that the fly-back diode 22 is ideally fast, namely that when a voltage is first applied to it that is poled for forward conduction the diode 22 conducts immediately. It will further be assumed that no signal voltage is applied to the input of the source transistor 10 at input terminal 26 so that the source transistor 10 tends to remain off. Now if the sink transistor 12 is repeatedly turned on and off by application of a binary signal at input terminal 28, as is the case in a typical sink chopping driver, then each time, $t_o$, the sink transistor 12 is turned on, a load current 30 (of magnitude $I_{30}$) flows to ground through the path including inductor 18, the load resistor 20 and the sink transistor 12. And each time, $t_a$, the sink transistor is turned off, the voltage across the inductor 18 reverses, forcing the load current 30 to continue to flow for a time through the fly-back diode 22 which fly-back current prevents the voltage across the source transistor 10 from reaching a large enough amplitude to damage it.

It is well know, however, that just after that providing transition time, $t_a$, and due to the fly-back diode 22 being forward biased, the voltage at point A becomes greater than Vbb. The base to collector junction of transistor 10 thus is forward biased due to a portion 31 of the large inductive fly-back load current flowing via resistor 24 into the base of transistor 10.

In applications of this circuit where the frequency of chopping is high so that the decaying fly-back current keeps the fly-back diode forward biased (at $V_{fd}$) during the short period in which the sink driver 12 is held off (from $t_a$ to $t_o$), then the output voltage (Vout) at node A and at the base of source transistor 10 will remain at $V_{bb} + V_{fd}$ up to the time $t_o$ at which the sink transistor 12 next turns on. The collector-base junction of the source transistor is also forward biased in the period and acquires a charge.

When the sink transistor 12 turns on, the voltage at the emitter of transistor 10 still exceeds Vbb as seen in FIG. 2. As soon as the load current 30 is transferred from the fly-back diode 22 through the sink transistor 12, at which time $t_b$, the voltage Vout at the emitter of transistor 10 (circuit point A) has decayed to the value Vbb, the charge stored in the base-collector junction of the source transistor 10 is released through the transistor 10 as well as through the parallel path via resistor 24, turning on transistor 10.

This results in a period, Td, wherein both the source and sink transistors 10 and 12 are on. The shoot through current 32 in transistor 10 which continues to flow through transistor 12 is superimposed on the load current 30. Line 34 in FIG. 2 represents the combined currents 33 flowing through transistor 12 in the period Td. Line 36 is the voltage at point A. Note that the turn off of the voltage at circuit point A is delayed by this shoot through current 32, by the delay time Td.

Referring to FIG. 3, the prior art circuit of FIG. 1 is shown with the addition of a PNP clamp transistor 40 connected emitter to collector between the base of the source transistor 10 and ground terminal 16, respectively. Also added are a clamp circuit 42 and a current source 44 that are series connected between the supply voltage terminal 14 and the ground terminal 16. The mid-connection point of this series connected circuit is at circuit point X and is tied to the base of the PNP clamp transistor 40.

This clamp circuit composed of the three components 40, 42 and 44 is for limiting the voltage at the base of the source transistor 10 to no more than Vbb. Diode 42 serves to clamp the emitter of clamp transistor 40 at Vbb and thus the base of the source transistor is clamped at Vbb. This clamping action takes place, and the portion 32 of fly-back load current 30 is now diverted through transistor 40 during each period that transistor 12 is off. The amplitude $I_{31}$ of the diverted current 31 that is drained to ground through clamp transistor 40 is Vfd/R, where R is the resistance of the resistor 24.

Now with reference to FIG. 4, it is seen that the voltage at point A, curve 48, collapses almost immediately as soon as the fly-back load current through the diode 22 has altogether become diverted through sink transistor 12, and the current $I_{32}$, curve 50, has superimposed on it almost no shoot through current component, and the output voltage at point A has a greatly reduced turn-off delay.

Furthermore, the clamp circuit of this invention does not complicate or interfere with the driving of the source transistor 10. The added clamp circuit also avoids charge storage in any of the clamp circuit components (40, 42 and 44) during the period of recirculating fly-back currents, and thus introduces no switching delays of its own.

In a second preferred embodiment shown in FIG. 5, a full wave bipolar bridge driver has two NPN source transistors 60 and 62, and two NPN sink transistors 64 and 66. Bias resistors 68 and 70 are connected from base to emitter respectively of the source transistors 62 and 64. Fly-back diodes 72, 74, 76 and 78 are connected from emitter to collector to driver transistors respectively 60, 62, 64 and 66. The load includes an inductor 80 in series with a resistor 82 that are series connected between the junction at circuit point A of the pair of source and sink transistors 60 and 64 on one side, and the junction at circuit point B of the pair of source and sink transistors 62 and 66.

A clamp circuit in the full-wave driver circuit of FIG. 5 is provided having the same clamp function as does the clamp circuit (components 40, 42 and 44) in the half-wave driver of FIG. 3. In FIG. 5 the clamp circuit includes a diode 84 and a current source 86 series connected between the voltage supply and ground terminals 88 and 90. This clamp circuit further includes two clamp PNP transistors 92 and 94 with the bases of both connected to the junction at circuit point X between the diode 84 and current source 86, with collectors of both connected to the ground terminal 90, and with emitters connected respectively to the bases of source transistors 60 and 62.

A high binary input voltage level is expected to be applied simultaneously to the input (base) terminals 94 and 96 (of driver transistors 60 and 66 respectively), while a low binary input voltage is applied to the input (base) terminals 98 and 100 (of driver transistors 62 and 64 respectively) when a load current 102 is to flow from A to B as shown in FIG. 5. The reverse polarities should be applied if the load current is to flow from B to A. The diode 84 and the clamp transistors 92 and 94 together clamp the bases of the source transistors 60 and 62 to a voltage no greater than Vbb. Thus, the advantage of the proposed clamping action previously described in connection with FIGS. 3 and 4 hold now when either transistor 64 is being chopped for direction B to A or transistor 66 is being chopped for direction A to B. And as in the half-wave circuit of this invention, there is in this full-wave bridge circuit of FIG. 5 no interference by the clamp circuit with the input signals and there is no introduction of currents that may cause charge storage in the clamp diode 84 or clamp transistors 92 and 94.

Although a passive inductive load including inductor 18 and series resistor 20 have been shown in FIGS. 3 and 5, this invention is intended to include use of any two terminal load that is inductive, e.g. the coil of an electromagnetic device such as a relay, solenoid or motor.

This invention is also intended to include any combination of half bridges, e.g. a half bridge of this invention as illustrated in FIG. 3. An example of the combination of two half bridges is shown in FIG. 5. Another particularly useful combination (not shown) will include three half bridges connected in parallel across the same DC voltage supply, wherein each half bridge has as its load one of the three windings of a three phase motor, e.g. a "Y" connected three phase brushless motor.

What is claimed is:

1. A totem-pole driver circuit of the kind having a positive voltage supply conductor and a ground conductor, an NPN source transistor and a sink switch connected respectively in series between said voltage supply and ground conductors, a fly-back diode connected collector-to-emitter in parallel with said source transistor, a biasing resistor connected between the base and emitter of said source transistor, and an output conductor at the junction of said source transistor and sink switch to which an inductive load may be connected, wherein the improvement comprises:
- a clamping circuit means for clamping the voltage at said base of said source transistor to a positive voltage that may be applied, respectively, across said voltage supply conductor and said ground conductor so that the voltage at said base is prevented from exceeding the positive supply voltage at said voltage supply conductor.

2. The driver circuit of claim 1 wherein said clamping circuit means is comprised of a PNP clamp transistor with emitter connected to said base of said source transistor; a clamp diode with anode connected to said voltage supply conductor and cathode connected to the base of said clamp transistor; and a current source connected between said base of said clamp transistor and said ground conductor, said current source being poled to draw current through said clamp diode.

3. The driver circuit of claim 1 wherein said sink switch is an NPN transistor having a collector connected to the emitter of said source transistor.

4. A fullwave bridge driver circuit of the kind having a positive voltage supply conductor and a ground conductor, a first NPN source transistor and a first sink switch connected in series between said voltage supply and ground conductors, respectively, a second NPN source transistor and a second sink switch connected in series between said voltage supply and ground conductors, respectively, a first and second fly-back diode connected in parallel with said first and second source transistors, respectively: a first and second biasing resistor connecting the base to the emitter of said first and second source transistors, respectively: a first and second fly-back diodes connected respectively across said first and second source transistors; and a circuit output point A at the junction of said first-source-transistor emitter and said first sink switch, and a circuit output point B at the junction of said second-source-transistor emitter and said first sink switch so that an inductive load may be connected across output points A and B and may be driven by an alternating current when said first source transistor and second sink switch on the one hand, and said second source transistor and said first sink source on the other hand are alternately turned on; wherein the improvement comprises:
- a clamping circuit means for preventing voltage swings at said bases of said first and second source transistors from exceeding a positive supply voltage that may be connected to said positive supply voltage conductor with reference to said ground conductor.

5. A fullwave bridge driver circuit of claim 4 wherein said clamping circuit comprises:
- a) first and second PNP clamp transistors having an emitter connected respectively to said bases of said first and second NPN source transistors, the collectors of said PNP transistors connected to said ground conductor;
- b) a clamp diode with anode connected to said voltage supply conductor and cathode connected to the bases of said PNP transistors: and
- c) a current source connected between said PNP-transistor bases and said ground conductors, said current source being poled to draw current through said clamp diode.

6. The fullwave bridge driver circuit of claim 4 wherein said first and second sink switches are first and second NPN transistors respectively, the collectors of said first and second sink switches being respectively connected to said emitters of said first and second NPN source transistors.

* * * * *